United States Patent
Lovicott et al.

(10) Patent No.: US 10,506,743 B2
(45) Date of Patent: Dec. 10, 2019

(54) SYSTEMS AND METHODS OF AUTOMATED OPEN-LOOP THERMAL CONTROL

(71) Applicant: Dell Products, L.P., Round Rock, TX (US)

(72) Inventors: Dominick Lovicott, Jarrell, TX (US); Hasnain Shabbir, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 36 days.

(21) Appl. No.: 15/618,885

(22) Filed: Jun. 9, 2017

(65) Prior Publication Data

US 2018/0359882 A1  Dec. 13, 2018

(51) Int. Cl.
*H05K 7/20* (2006.01)

(52) U.S. Cl.
CPC .............. *H05K 7/20727* (2013.01)

(58) Field of Classification Search
CPC . H05K 7/20836; H05K 7/20727; G05B 15/02
See application file for complete search history.

(56) References Cited

U.S. PATENT DOCUMENTS

| | | | | |
|---|---|---|---|---|
| 8,560,142 B2* | 10/2013 | Benlarbi | ............... | G06F 1/206 700/278 |
| 9,820,409 B1* | 11/2017 | Ross | ............... | H05K 7/20736 |
| 2007/0089446 A1* | 4/2007 | Larson | ............... | G05D 23/1931 62/259.2 |
| 2008/0312888 A1* | 12/2008 | Vinson | ............... | G06F 1/20 703/2 |
| 2013/0083481 A1* | 4/2013 | Goto | ............... | H05K 7/20209 361/695 |
| 2014/0365264 A1* | 12/2014 | Smiley | ............... | G06Q 10/06315 705/7.25 |
| 2016/0037686 A1* | 2/2016 | Shabbir | ............... | G06F 1/206 700/300 |
| 2016/0135333 A1* | 5/2016 | Lovicott | ............... | H05K 7/20836 361/679.48 |
| 2018/0035572 A1* | 2/2018 | Song | ............... | H05K 7/20836 |

* cited by examiner

*Primary Examiner* — Thomas C Lee
*Assistant Examiner* — Michael Tang
(74) *Attorney, Agent, or Firm* — Fogarty LLP

(57) ABSTRACT

Method, systems are provided for providing automated open-loop control of an airflow cooling system in an IHS (Information Handling System), where the open-loop control is automatically adjusted based on changes to the components installed by the IHS. An airflow impedance, providing an amount a component physically impedes airflow, is retrieved for a new component. An estimated airflow delivery to the installed location of the new component is determined and scaled based on the airflow impedance of the new component and based on the ability to bypass the new component with ventilated airflow. An airflow delivery target for the new component is determined based on the ambient air temperature available at the installed new component. The airflow delivery target is scaled based on the installed location of the new component. The airflow cooling system is operated to equalize the estimated airflow delivery to the new component with the airflow delivery target for new component.

20 Claims, 3 Drawing Sheets

SYSTEMS AND METHODS OF AUTOMATED OPEN-LOOP THERMAL CONTROL

FIELD

This disclosure relates generally to cooling within an Information Handling System (IHS), and more specifically, to airflow cooling within an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of various internal components of the IHS, possibly resulting in costly malfunctions and component failures. In order to ventilate heated air out of the IHS and away from internal components, an IHS may utilize a cooling fan, or a plurality of cooling fans organized within an airflow cooling system. As temperatures within the IHS increase, the cooling fans may be used to ventilate heated air from within the IHS, or from within certain internal compartments of the IHS. Certain IHSs may utilize a single cooling fan to ventilate heated air from within the IHS. Other IHSs may utilize complex airflow cooling systems that include one or more banks of cooling fans.

An IHS airflow cooling system may utilize an open-loop control or a closed-loop control system in order to determine fan speed settings for the one or more cooling fans that are available to the cooling system of the IHS. Closed-loop control systems typically utilize measured temperature information collected from temperature sensors located at various locations within the IHS. Based on the collected temperature information, a closed-loop control system may operate the cooling fans in order generate sufficient airflow cooling to maintain the temperatures of internal components at or below desired target values. Open-loop control systems, on the other hand, do not utilize sensor feedback and instead rely on preset fan speed configurations, such as a thermal table that specifies fan speed settings for various possible hardware configurations within the IHS.

Closed-loop thermal control systems provide the ability to precisely control fan speeds based on observed conditions within the IHS. As such, closed-loop control systems may both reduce unnecessary operation of the cooling fans, while still ensuring component temperature levels remain at or below a desired target value. However, the processing and network resources required for implementing sensor data collection mechanisms required for a closed-loop control system may adversely affect the performance of the IHS. For instance, sensor data collection mechanisms that rely on polling of temperature sensors may noticeably impact the operation of the component that is being monitored, such as latency in certain data storage operations resulting from the collection of temperature data from sensors provided by high-speed storage drives. Due to such performance impacts, certain cooling systems support disabling of temperature polling for certain components, such as for high-speed storage drives. Sensor failures, or other problems that prevent the collection of temperature information required in closed-loop control systems, may result in the cooling system of an IHS failing to respond to rising temperatures, which may cause overheating, and potentially damage, to components of the IHS. Such sensor failures may be detected by the cooling system, but fail-over operations by cooling systems typically involve setting the cooling fans to a safe, but unnecessarily high, fan speed setting. In certain IHSs, closed-loop control systems may be limited due to insufficient sensor data.

Due to such issues associated with closed-loop control systems, in certain scenarios open-loop control systems may be preferable. Open-loop control systems operate based on predefined fan speed settings that may be determined based on the hardware configuration of the IHS. As such, open-loop control systems may not be forward-compatible with new hardware configurations, and thus are limited to providing efficient cooling only for scenarios that are accounted for within thermal tables that provide the various predefined fan speed settings. In certain cases, any updates or changes to these thermal tables in order to account for changes in the hardware configuration of an IHS requires updating the firmware for a fan controller that implements the open-loop system.

SUMMARY

In various embodiments, a system for providing airflow cooling in an IHS (Information Handling System) includes: one or more cooling fans configured to generate airflow that ventilates heated air from within the IHS, wherein the generated airflow provides cooling to one or more storage devices installed in the IHS; a fan controller configured to operate the one or more cooling fans to provide cooling to a first storage device of the one or more storage devices, wherein the fan controller is further configured to: retrieve airflow impedance information for the first storage device; determine an estimated airflow delivery by the one or more cooling fans to the first storage device, wherein the estimated airflow delivery for the first storage device is scaled based on the airflow impedance information for the first storage device; determine an airflow delivery target for the first storage device based on an ambient air temperature available at the installed location of the first storage device; wherein the airflow delivery target for the first storage device is scaled based on an installed location of the first storage device; and operate the one or more cooling fans in order to equalize the estimated airflow delivery to the first storage device with the airflow delivery target for the first storage device.

In certain additional airflow cooling system embodiments, the estimated airflow delivery for the first storage device is further scaled based on a measure of the ability to ventilate heated air by bypassing the first storage device. In certain additional airflow cooling system embodiments, the measure of the ability to ventilate heated air by bypassing the first storage device is determined based on characteristics of a first drive bay of the IHS in which the first storage device is installed. In certain additional airflow cooling system embodiments, the measure of the ability to ventilate heated air by bypassing the first storage device is further determined based on characteristics of one or more drive bays of the IHS that are adjacent to the first drive bay. In certain additional airflow cooling system embodiments, the airflow delivery target for the first storage device is further scaled based on the ambient air temperature available at the installed location of the first storage device. In certain additional airflow cooling system embodiments, the airflow impedance information provides an amount the first storage device physically impedes airflow once the first storage device is installed. In certain additional airflow cooling system embodiments, the scaling of the airflow delivery target for the first storage device is further based on a reliability parameter for the first storage drive and an accessibility of the installed location of the first storage device in the IHS.

In various embodiments, a method for utilizing one or more cooling fans to provide airflow cooling to a component of an IHS (Information Handling System) includes: retrieving airflow impedance information for the component; determining an estimated airflow delivery by the one or more cooling fans to the component, wherein the estimated airflow delivery for the component is scaled based on the airflow impedance information for the component; determining an airflow delivery target for the component based on an ambient air temperature available at the installed location of the component; wherein the airflow delivery target is scaled based on an installed location of the component in the IHS; and operating the one or more cooling fans in order to equalize the estimated airflow delivery to the first component with the airflow delivery target for the component.

In certain additional method embodiments, the estimated airflow delivery for the component is further scaled based on a measure of the ability to ventilate heated air from within the IHS by bypassing the component. In certain additional method embodiments, the measure of the ability to ventilate heated air by bypassing the component is determined based on characteristics of the installed location of the component. In certain additional method embodiments, the measure of the ability to ventilate heated air by bypassing the component is further determined based on characteristics of one or more components installed adjacent to the installed location of the component. In certain additional method embodiments, the airflow impedance information provides an amount the component physically impedes airflow once the component is installed. In certain additional method embodiments, the available ambient temperature is determined based on the installed location of the component relative to an air inlet of the IHS. In certain additional method embodiments, the scaling of the airflow delivery target for the component is further based on a reliability parameter for the component and an accessibility of the installed location of the component in the IHS.

In various embodiments, an IHS includes: one or more cooling fans configured to generate airflow that ventilates heated air from within the IHS, wherein the generated airflow provides cooling to one or more storage devices installed in the IHS; a fan controller configured to operate the one or more cooling fans to provide cooling to a first storage device of the one or more storage devices, wherein the fan controller is further configured to: retrieve airflow impedance information for the first storage device; determine an estimated airflow delivery by the one or more cooling fans to the first storage device, wherein the estimated airflow delivery for the first storage device is scaled based on the airflow impedance information for the first storage device; determine an airflow delivery target for the first storage device based on an ambient air temperature available at the installed location of the first storage device; wherein the airflow delivery target for the first storage device is scaled based on an installed location of the first storage device in the IHS; and operate the one or more cooling fans in order to equalize the estimated airflow delivery to the first storage device with the airflow delivery target for the first storage device.

In certain additional IHS embodiments, the estimated airflow delivery for the first storage device is further scaled based on a measure of the ability to ventilate heated air by bypassing the first storage device. In certain additional IHS embodiments, the measure of the ability to ventilate heated air by bypassing the first storage device is determined based on characteristics of a first drive bay of the IHS in which the first storage device is installed. In certain additional IHS embodiments, the measure of the ability to ventilate heated air by bypassing the first storage device is further determined based on characteristics of one or more drive bays of the IHS that are adjacent to the first drive bay. In certain additional IHS embodiments, the airflow impedance information provides an amount the first storage device physically impedes airflow once the first storage drive is installed. In certain additional IHS embodiments, the scaling of the airflow delivery target for the first storage device is further based on a reliability parameter for the first storage device and on an accessibility of the installed location of the first storage device in the IHS.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, a network router, a network video camera, a data recording device used to record physical measurements in a manufacturing environment, or any other suitable device and may vary in size, shape, performance, functionality, and price. The IHS may include memory, one or more processing resources, e.g., a central processing unit (CPU) or hardware or software control logic. Additional components or the IHS may include one or more storage devices, one or more communications ports for communicating with external devices as well as various input and output (I/O) devices, e.g., a keyboard, a mouse, and a video display. The IHS may also include one or more buses operable to transmit communication between the various hardware components.

Figure 1:
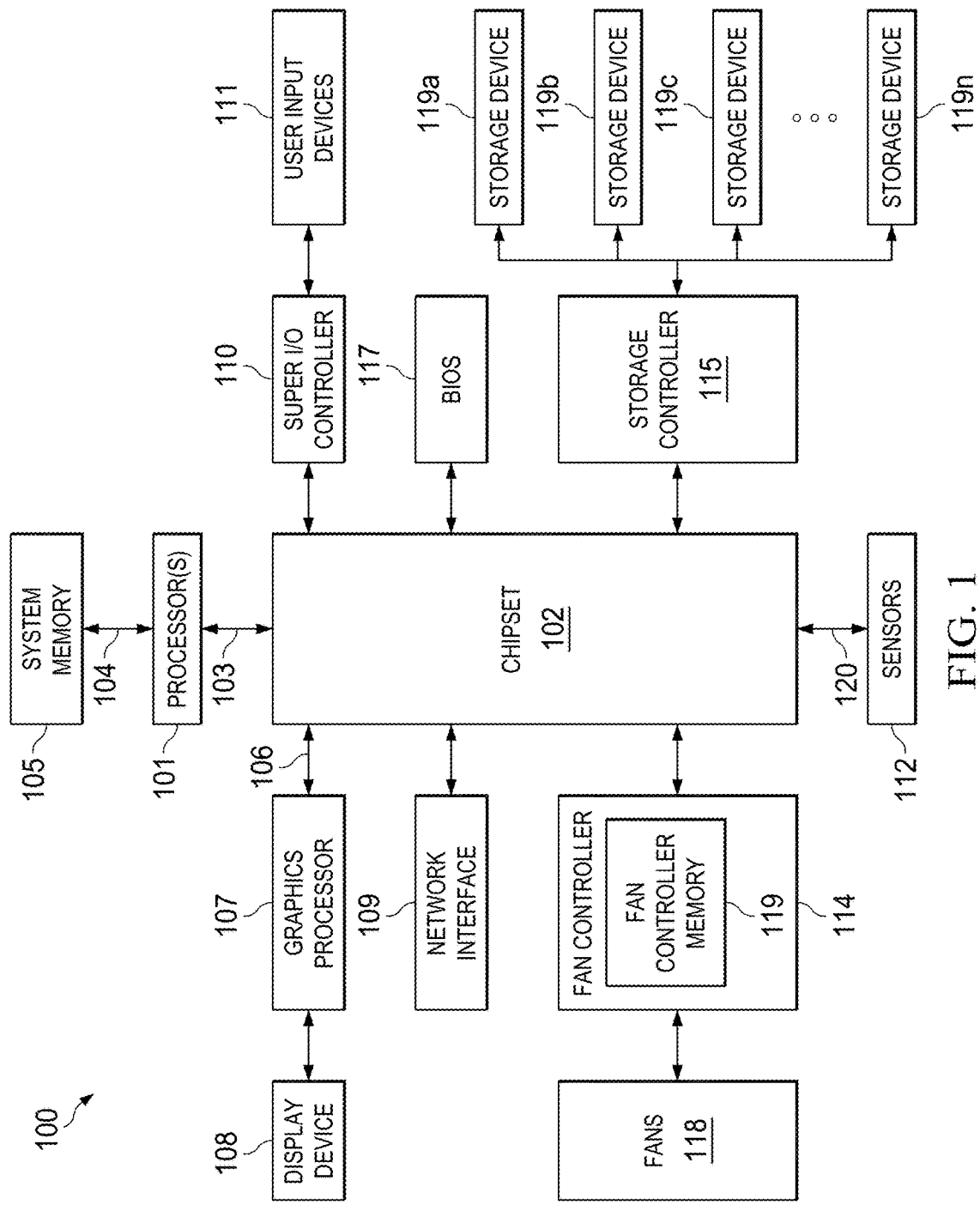
FIG. 1 is a block diagram depicting certain components of an IHS configured according to various embodiments.

FIG. 1 is a block diagram of an IHS 100 configured according to certain embodiments for automated open-loop thermal control of an airflow cooling system. IHS 100 may include one or more processors 101. In various embodiments, IHS 100 may be a single-processor system or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs). IHS 100 includes a system memory 105 that is coupled to processor 101 via a memory bus 104. System memory 105 provides processor 101 with a high speed memory that may be used in the execution of computer program instructions by the processor 101. Accordingly, system memory 105 may include one or more memory modules, such as SDRAM (Synchronous Dynamic Random-Access Memory), suitable for supporting high-speed memory operations by the processor 101.

IHS 100 includes a chipset 102 that may include one or more integrated circuits that are connect to processor 101. In certain embodiments, the chipset 102 may utilize a QPI (QuickPath Interconnect) bus 103 for communicating with the processor 101. In the embodiment of FIG. 1, chipset 102 is depicted as a separate component from processor 101. In other embodiments, all of chipset 102, or portions of chipset 102 may be implemented directly within the integrated circuitry of the processor 101. Chipset 102 provides the processor 101 with access to a variety of resources provided by peripheral components that are coupled to IHS 100.

Chipset 102 may provide access to a graphics processor 107. In certain embodiments, graphics processor 107 may be comprised within one or more video or graphics cards that have been installed on IHS 100. Graphics processor 107 may be coupled to the chipset 102 via a graphics bus 106 such as provided an AGP (Accelerated Graphics Port) bus or a PCI (Peripheral Component Interconnect or) bus. In certain embodiments, graphics processor 107 generates display signals and provides them to a coupled display device 108. In certain embodiments, chipset 102 may also provide access to one or more user input devices 111. In such embodiments, chipset 102 may be coupled to a super I/O controller 110 that provides interfaces for variety of user input devices 111, in particular lower bandwidth and low data rate devices. For instance, chipset 110 may provide access to a keyboard and mouse or other peripheral input devices. In certain embodiments, chipset 110 may be used to interface with coupled user input devices 111 such as keypads, biometric scanning devices, and voice or optical recognition devices. The user input devices 111 may interface with super I/O controller 110 through wired or wireless connections. In certain embodiments, chipset 102 may also be coupled to a network interface 109, such as provided by a Network Interface Controller (NIC). According to various embodiments, network interface 109 may support communication via various wired and/or wireless networks.

Another resource that may be accessed by processor 101 via chipset 102 is BIOS 117. The BIOS 117 provides an abstraction layer for interfacing with certain hardware components that are utilized by IHS 100. Via this hardware abstraction layer provided by BIOS 117, the software executed by the processor 101 of IHS is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. Upon booting of the IHS 100, processor 101 may utilize BIOS 117 instructions to initialize and test hardware components coupled to the IHS and to load an Operating System (OS) for use by the IHS 100. In certain embodiments, the BIOS may be replaced, in full or in part, by a baseboard management controller (BMC) or another in-band or out-of-band controller that supports remote administration of IHS 100.

Chipset 102 also provides access to one or more storage devices 119a-n. In the illustrated embodiment, the chipset 102 utilizes a storage controller 115 that is coupled to each of the storage devices 119a-n. The storage controller 115 may manage various aspects of the storage devices 119a-n, including the transfer of data to and from the storage devices. In certain embodiments, the storage controller 115 may be a RAID (Redundant Array of Independent Disks) controller that is used in the implementation of a RAID data storage system that distributes stored data across two or more of the storage devices 119a-n. In various embodiments, the storage devices 119a-n may be integral to the IHS 100, or may be external to the IHS 100. As described with respect to FIG. 2, certain of the supported storage devices 119a-n may be installed in drive bays on either the front or rear of the IHS, or may be installed in an internal compartment of the IHS. In various embodiments, the storage devices 119a-n may include SAS (Serial Attached SCSI) magnetic disk drives, SATA (Serial Advanced Technology Attachment) magnetic disk drives, solid-state drives (SSDs) and/or various other types of storage drives in various combinations.

The illustrated embodiment, the chipset 102 also provides access to a fan controller 114 that may be used to operate an airflow cooling system that includes one or more cooling fans 118. More specifically, the fan controller 114 may generate a target airflow within the internal compartments of the IHS 100 by operating and adjusting the speed of the cooling fans 118 that comprise the airflow cooling system. The fan controller 114 may include an internal fan controller memory 119 that may be used to store data relied upon by fan controller 114. In certain embodiments, the fan controller memory 119 may store tables of configuration settings and boundary conditions for the cooling fans 118 operated by the fan controller 114. In certain embodiments, the fan controller memory 119 may be used to store one or more correlations that may be used to calculate airflow requirements. Such thermal tables and/or correlations stored in the internal memory 118 of the fan controller 114 may be used as described with respect to the automated open-loop thermal control process described in FIG. 3.

The fan controller 114 may be configured to interoperate with one or more environmental sensors 112 in order to monitor temperature conditions at one or more internal locations within the IHS 100. In scenarios where the fan controller 114 implements closed-loop thermal control, the fan controller 114 may utilize temperature readings provided by the sensors 112 in operating the cooling fans 118. In such scenarios, the fan controller 114 may communicate with the sensors 112 directly, such as via an I2C bus interface 120 supported by the IHS chipset 102. In other scenarios, the fan controller 114 may instead receive information from the sensors 112 indirectly via software processes that monitor and collect the sensor information. In certain embodiments, the fan controller 114 may be an embedded microcontroller on the motherboard of the IHS 100. In other embodiments, the fan controller 114 may be a stand-alone integrated circuit board that is installed within an internal compartment of the IHS 100. In certain embodiments, the fan controller 114 may be configured to interoperate with a baseboard management controller that enables remote administration of the fan controller. In certain of such embodiments, various aspects of the operation of the cooling fans 118 by the fan controller 114 may be implemented by the baseboard management controller.

Not all IHSs 100 include each of the components shown in FIG. 1, and other components not shown may exist. Furthermore, some components shown as separate may exist in an integrated package or be integrated in a common integrated circuit with other components. For example, various of the resources provided via chipset 102 may instead be integrated into the one or more processor(s) 101 as a system-on-a-chip.

Figure 2A:
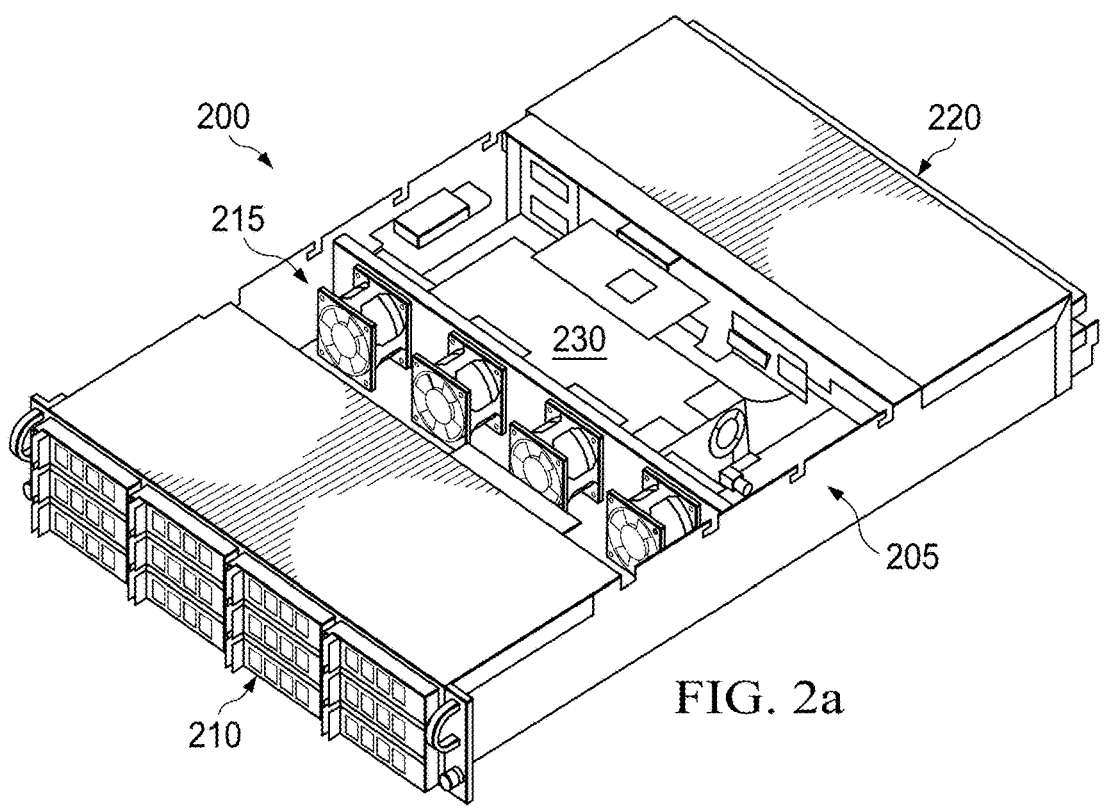
FIG. 2a is a front-facing illustration depicting certain components of an IHS configured to provide multiple storage drive locations.
Figure 2B:
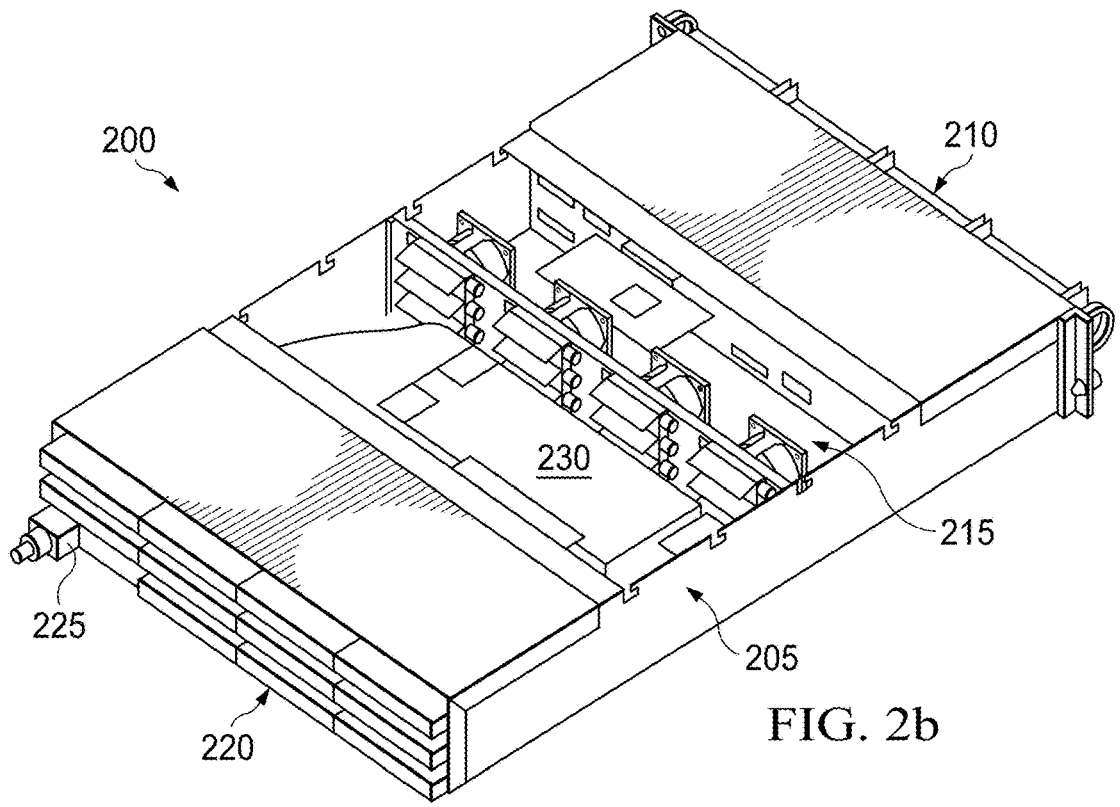
FIG. 2b is a back-facing illustration depicting certain components of an IHS configured to provide multiple storage drive locations

As described, an IHS may utilize a cooling system comprised of one or more cooling fans that ventilate heated air from within an IHS that supports multiple storage drives. These storage drives may be managed by a storage controller in support of a data storage system that stores data to these storage drives. FIGS. 2a-b are illustrations of a server IHS 200, such as a blade server or rack server, that includes a bank of cooling fans 215 that are part of the airflow cooling system of the IHS 200. FIG. 2a is a front-facing illustration of the IHS 200. FIG. 2b is a rear-facing illustration of the same IHS 200. In both FIGS. 2a and 2b, the IHS 200 is illustrated with a portion of the enclosure removed to reveal components and internal compartments of the chassis 205 of the IHS 200. As illustrated, the bank of four cooling fans 215 extends across a midplane of the chassis 205 of the IHS 200. Based on commands received from a fan controller, such as described with regard to fan controller 114 of the embodiment of FIG. 1, the bank of cooling fans 215 may be operated to ventilate heated air from within the IHS 200. Other IHSs may utilize various other configurations of cooling fans that may include different numbers of cooling fans that may be physically oriented in various different configurations.

The cooling fans 215 may be operated to force air towards the front of the IHS 200 such that the air is forced through the gaps between the storage drives 210 and the gaps between the storage drives 210 and the surrounding enclosure of the IHS. As illustrated in FIG. 2a, the front face of IHS 200 includes drive bays that are occupied by twelve storage drives 210 that are organized into four columns, each column containing three stacked storage drives. Each of these storage drives may be removed from a drive bay of the IHS and re-installed or replaced with a different storage drive that is compatible with this drive bay. The airflow cooling system may utilize the bank of cooling fans 215 to ventilate heated air from within the internal compartments of the IHS via gaps between and around the individual front-facing storage drives 210. As described with regard to the embodiment of FIG. 3, the ability of the cooling fans 215 to ventilate air between these gaps may depend on various physical characteristics of these individual storage drives 210 and may also depend on the physical characteristics of the drive bay in which a particular storage drive is installed.

As illustrated in FIG. 2b, the rear face of IHS 200 includes drive bays in which additional storage drives 220 may be installed. Similar to the storage drives on the front face 210 of IHS 200, the rear face of the IHS 200 includes drive bays that are likewise occupied by four columns of storage drives 220 each column supporting three stacked storage drives. However as illustrated in FIG. 2b, one of the storage drives on the rear face of IHS 200 has been replaced with an external connector 225, which may support any variety of connection that may be utilized by the IHS. For instance, external connector 225 may provide a power source connection or a data connection to a network or to another IHS. Various different external connectors may be utilized in place of any number of the storage devices on the rear face 220 of IHS 200. In certain scenarios, external connectors may likewise be utilized in place of storage drives on the front face 210 of IHS 200. As with the front-facing storage drives 210, the rear-facing storage drives 220 may be cooled via the ventilation of air by the cooling fans 215 through the gaps between and around the storage drives 220. As described with regard to the embodiment of FIG. 3, the ability of cooling fans 215 to ventilate air through gaps between and around a particular storage drive may depend on the airflow impedance characteristics of any external connectors 225 utilized in drive bays adjacent to the installed location of the storage drive.

As illustrated in FIGS. 2a and 2b, an IHS 200 may include an internal compartment 230 in the middle portion of the IHS. In certain scenarios, additional storage drives may be located in this internal middle compartment 230 of the IHS 200. Storage drives may be installed in various locations within this internal middle compartment 230. Storage drives installed within the internal middle compartment 230 of IHS 200 are cooled by the ventilation of heated air from within this compartment by the cooling fans 215. The ability of cooling fans 215 to cool these internal storage drives may depend on the manner in which these storage drives have been installed within the internal middle compartment 230. For instance, in certain scenarios, these internal storage drives may be installed individually as freestanding components, while in other scenarios, these internal storage drives may be stacked within internal drive bays installed within the internal middle compartment 230. Similar to the front-facing and rear-facing storage drives, the ability to cool storage drives installed within stacked internal drive bays may depend on the ability of the cooling fans 215 to ventilate heated air between and around these stacked internal storage drives.

In most scenarios, front-facing storage drives 210 will be easily accessible to technicians, thus allowing these front-facing storage drives to be easily removed and replaced. In certain scenarios, the rear storage drives 220 may be reasonably accessible to technicians. However, in other scenarios, the IHS 200 may be situated such that the rear storage drives 220 may be relatively difficult to access by technicians. Without regard to the practical difficulty in accessing the rear storage drives 220, these drives may nonetheless be removable and replaceable similar to the front storage drives 210. In certain scenarios, the front-facing and/or rear-facing storage drives to 210 and 220 may be hot-swappable storage drives that may be removed and replaced without shutting down IHS 200. Storage drives located within the internal middle compartment 230 of the IHS 200 may be replaced. In certain scenarios, the IHS 200 may be configured such that storage drives installed in the internal middle compartment 230 are hot-swappable, similar to the front-facing and rear-facing drives. However, in some scenarios, storage drives installed in the internal middle compartment 230 may be replaced only after the IHS 200 has been shut down and removed from the rack structure in which it is housed. A technician may then be required to remove the enclosure of the IHS 200 in order to access the internal middle compartment 230. Due to such variances in the difficulty of replacing a storage drive depending on its installed location within the IHS 200, certain implementations may require higher reliability for storage drives that are more difficult to replace.

Figure 3:
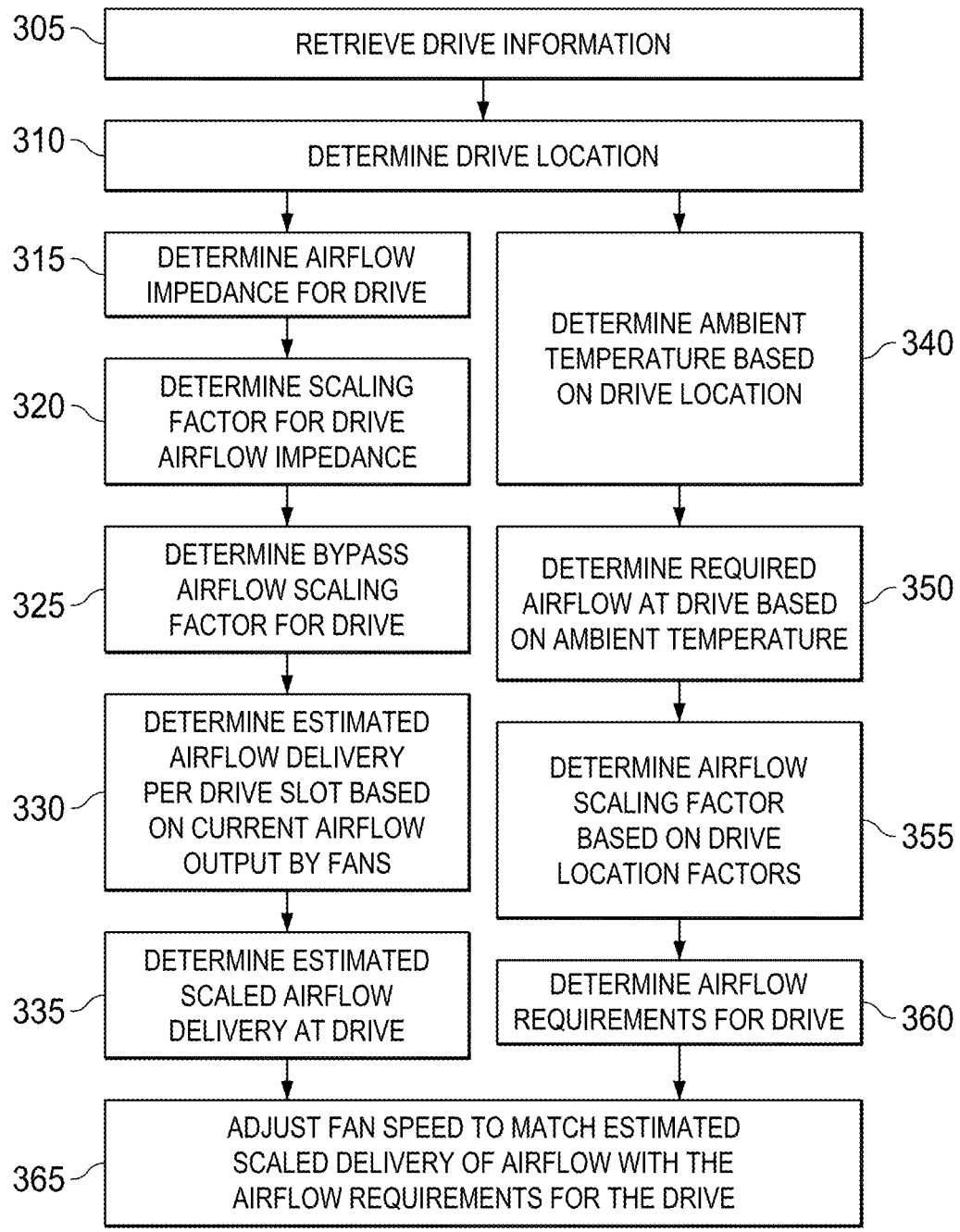
FIG. 3 is a flowchart describing certain steps of a process according to various embodiments for thermal control of an airflow cooling system of an IHS.

FIG. 3 is a flowchart describing certain steps of a process according to various embodiments for automated open-loop thermal control of an airflow cooling system of an IHS. In certain embodiments, the thermal control process may be implemented in an IHS such as IHS 200 described with regard to FIGS. 2a and 2b and IHS 100 described with regard to FIG. 1. As described, storage drives may be removed from the IHS and potentially replaced with a different storage drive, which may have different thermal characteristics from the storage drive. In certain scenarios, the process of FIG. 3 may be utilized to determine and provide the airflow cooling required by a newly installed storage drive. The process of FIG. 3 may also be utilized to periodically evaluate and adjust the airflow cooling provided to any of the installed storage drives. In certain scenarios, the process of FIG. 3 may be utilized to evaluate and adjust the airflow cooling provided to a storage drive installed in a particular drive bay based on the changes in the components that are installed in adjacent drive bays.

In the illustrated embodiment, the thermal control process of FIG. 3 begins at step 305 with the retrieval of information describing certain thermal characteristics of a selected individual storage drive for which an airflow adjustment is being determined. In certain embodiments, the storage drive information may be retrieved from a central repository of configuration information that is provided to the airflow cooling system. The storage drive information for a particular storage drive may be provided by the manufacturer of the storage drive, and subsequently made available via the central repository. The storage drive information for a particular storage drive may otherwise be provided by a third-party that determines the characteristics of a storage drive based on empirical testing. Storage drive information may also be provided by the manufacturer of the IHS and its airflow cooling system. The storage drive information made available via the central repository may be obtained and/or provided by various other parties in various embodiments. At step 305, the repository of storage drive information is accessed in order to retrieve certain thermal characteristics pertaining to the selected storage drive.

At step 310, the location of the storage drive within the IHS of the airflow cooling system is determined. As described with respect to FIGS. 2a and 2b, a storage drive may be installed in multiple different locations within an IHS. In the example of FIGS. 2a and 2b, storage drives may be plugged into drive bays located on the front face of the IHS, or may instead be plugged into drive bays located on the rear face of the IHS, or may be installed within an internal middle compartment of the IHS. This location of the installed storage drive within the IHS is determined at step 310. In certain embodiments, such location information may be available via a software interface to the data storage system that is comprised of the various storage drives supported by the IHS. For instance, in the embodiment of FIG. 1, storage controller 115 manages access to storage drives 119a-n and may thus be configured to provide the installed location for each of the supported storage drives within IHS 100. In other embodiments, location information for a storage drive may be available through queries to other interfaces provided within the IHS, such as through queries to a baseboard management controller configured to provide remote administration capabilities for the IHS.

The thermal control process may continue at step 315 with the determination of an airflow impedance for the selected storage drive. In certain scenarios, the airflow impedance may be provided directly in the storage drive information retrieved at step 305. In other embodiments the airflow impedance for a storage drive may be determined based on physical characteristics of the drive provided in the retrieved storage drive information. The airflow impedance for a particular storage drive provides a measure of the degree to which the storage drive physically impedes the flow of air past the drive via the gaps that surround the storage drive. As described, the airflow cooling system utilizes one or more fans to ventilate air from within the internal compartments of an IHS in order to provide cooling to the electronic components installed within these internal compartments. In certain scenarios, the airflow cooling fans draw in ambient air through one or more vents in the chassis and enclosure of the IHS. The ambient air drawn in by the cooling fans is then used to ventilate heated air out of the IHS.

In order to provide cooling to components such as the front-facing, rear-facing and internal sets of storage drives described with respect to FIGS. 2a and 2b, the cooling fans ventilate air through the gaps between and around the individual storage drives. For instance, in providing cooling to a selected storage drive installed in a front-facing 210 drive bay of the IHS, the bank of cooling fans 215 may ventilate air through the gaps between the selected storage drive and neighboring storage drives installed in drive bays adjacent to the selected storage drive. In scenarios where the selected storage drive is installed in a drive bay along the outer border of the front face of the IHS, the cooling fans 215 may ventilate air through gaps between the selected storage drive and the enclosure that forms the border of the front-face of the IHS.

The airflow impedance for a storage drive is based at least in part on the degree to which the storage drive blocks air from ventilating between these gaps surrounding the installed storage drive. As storage drives evolve, the physical dimensions of the drives tend to occupy increasingly larger portions of the available volume of the drive bays that house the storage drives, thus resulting in higher airflow impedances. In certain embodiments, the airflow impedance for a storage drive may also be a function of the physical characteristics of the drive bay in which the storage drive is installed, since physical aspects of the drive bay itself may further contribute to the airflow impedance of the storage drive housed in the drive bay.

At step 320, a scaling factor for the airflow impedance of the selected storage drive is determined. As described with respect to step 315, an airflow impedance value may be obtained for the selected storage drive, such as by querying the storage drive itself or by querying a central repository that maintains such information. The obtained airflow impedance value for a storage drive may be a continuous value, or may be selected from a discrete set of values. In certain embodiments, this obtained airflow impedance value for a storage drive may be characterized according to a tiered classification system for airflow impedances.

For instance, certain storage drives may have airflow impedance values that fall within a first tier of airflow impedances. Storage drives that have airflow impedances values that fall within this first tier do not impede airflow past a reference airflow impedance. As such storage drives within this first tier may have a scaling factor of one, indicating there is no reduction in airflow for a storage drive beyond the reference airflow impedance. Storage drives that have airflow impedances values that fall within a second tier may indicate the installation of this drives results in specified reduction in airflow beyond the reference airflow impede. For instance, storage drives with second-tier airflow impedances may have a scaling factor of 0.95, indicating a 5% reduction in airflow beyond the reference airflow impedance. Storage drives with airflow impedance values that fall within a third tier may have a scaling factor of 0.9, indicating a 10% reduction in airflow beyond the reference airflow impedance. A fourth tier, with a 0.8 scaling factor, may be used for storage drives that have airflow impedance values that are 20% greater than the reference airflow impedance. Various embodiments may utilize various different tiered classification systems for airflow impedance values and various scaling factors associated with each tier.

The airflow impedance for an installed storage drive may be based on the physical properties of the storage drive itself and the physical properties of the location in which the storage drive is installed. At step 325, physical characteristics of the location of the installed storage drive within the IHS may be used to determine an additional bypass scaling factor for the airflow impedance of the selected storage drive. As described, a storage drive may be installed in a front-facing set of drive bays, a rear-facing set of drive bays, or within an internal compartment of the IHS. As illustrated in FIGS. 2*a* and 2*b*, an IHS 200 may include a front-facing set of storage drives 210 and a rear-facing set of storage drives 220, where each of the two sets of storage drives may conform to a different form factor based on the physical constraints of each set of drive bays. For instance, in one scenario, the front-facing drive bays 210 may support 3.5-inch storage drives, while the rear facing drive bays 220 may support 2.5-inch storage drives. Accordingly, the drive bays utilized by the front-facing storage drives may differ significantly from the drive bays utilized by the rear-facing storage drives. Such physical differences in the drive bays that house the storage drives may further affect the ability of the cooling system to bypass the installed storage drive by ventilating heated air though the gaps that surround the installed storage drive.

In addition to the characteristics of the drive bay in which the selected storage drive is installed, other factors may also affect the ability of the cooling system to ventilate heated air by bypassing the storage drive. For instance, as illustrated in FIGS. 2*a* and 2*b*, an IHS may be comprised of various internal compartments that may be formed by one or more backplanes and/or midplanes that traverse the chassis of the IHS. Different IHSs may be constructed with varying numbers and sizes of internal compartments. In certain scenarios, such structural differences may affect the ability to bypass the storage drive with ventilated air.

Another factor that may affect the ability to ventilate air past a storage drive installed in a particular drive bay, is the installation status for neighboring drive bays. In certain scenarios, one or more drive bays may be left open with no storage drive installed. In other scenarios, drive bays that are not in use may be covered with a protective plate. A storage drive installed next to an open drive bay may allow substantial amounts of bypass airflow around a storage drive, while a storage drive installed next to a drive bay closed with a protective plate may restrict the bypass airflow for the storage drive. As described with regard to FIG. 2*b*, one or more of the drive bays may be utilized for external connectors, instead of storage drives. When installed in a drive bay, such external connectors may provide varying amounts of bypass airflow for adjacent storage drives.

At step 325, such factors related to the ability to bypass the storage drive are used to determine a bypass scaling factor for a particular storage drive. As described with respect to step 320, a scaling factor is determined for the selected storage drive. For instance, a storage drive installed within a front-facing drive bay of the IHS that supports 2.5-inch storage drives may be assigned a 0.9 bypass scaling factor, indicating a 10% reduction in airflow for the storage drive compared to the reference airflow impedance. In certain scenarios, an updated 2.5-inch storage drive may have higher airflow impedance, resulting in a 0.85 bypass scaling factor, indicating a 15% reduction in airflow for this updated storage drive. In certain scenarios, a storage drive installed within a rear-facing drive bay of the IHS that supports 3.5-inch storage drives may be assigned a 0.8 bypass scaling factor, indicating a 20% reduction in airflow compared to the reference airflow impedance. As reflected in these scaling factors, the use of larger storage drives may result in fewer gaps between the individual storage drives, thus further impeding the ability to bypass ventilated air past the larger storage drives.

These bypass scaling factors for a selected storage drive may be further adjusted, at step 325, based on the installation status of neighboring drive bays. For instance, in certain scenarios, the 0.8 scaling factor for a selected 3.5" storage drives may be adjusted to a 0.95 scaling factor, indicating a 5% reduction in airflow compared to a reference airflow impedance, based on the determination that the storage drive is located next to an open drive bay that is uncovered. In this scenario, the opening provided by the empty neighboring drive bay improves the ability to ventilate heated air from the selected storage drive. However, in other scenarios, the opening provided by the empty neighboring drive bay may instead serve to divert airflow from the selected storage drive, such that additional airflow will be required to ventilate the selected storage drive. In such scenarios, the effect of the empty neighboring drive bay may thus result in the 0.8 scaling factor for the selected 3.5" storage drive instead being adjusted to a 0.7 scaling factor, indicating a 30% reduction in airflow.

In certain scenarios, empty drive bays slots may be covered using a variety of protective plates, some of which may include vents or similar openings that allow airflow through the empty drive bay slot. For instance, in certain scenarios where an empty drive bay is covered using an unvented, protective cover plate that serves to impede the bypass airflow around adjacent storage drives, the 0.8 scaling factor for the selected storage drive bay may be adjusted to 0.7, indicating a 30% reduction in airflow. However, in scenarios where a vented cover plate is utilized, the bypass airflow around adjacent storage drives is improved such that the 0.8 scaling factor for the selected storage drive may be adjusted to 0.9, indicating a 10% reduction in airflow at the selected storage drive.

For storage drives installed within internal compartments of an IHS, scaling factors may likewise be used to reflect the ability ventilate these internal drives via the bypass of airflow around the installed storage drive location. For a single, standalone internal storage drive, a scaling factor of 1.0 may be utilized to indicate no reduction in bypass airflow compared to a reference airflow impedance. However, for internal storage drives installed within an array of internal drive bay slots, scaling factors similar to those for front-facing and rear-facing storage drives may be utilized.

The scaling factors that account for the airflow impedance of the selected storage drive and the ability to bypass ventilated air past the installed location of the selected storage drive may then be applied to determine an estimate for the airflow that is being delivered to the installed location of the selected storage drive. At this step 330, an estimate for the total airflow delivery of the airflow cooling system is determined. In certain embodiments, this estimate for total airflow delivery may be determined based on the current airflow output of the cooling fans. The airflow output currently being generated by the cooling fans may be obtained directly by querying a fan controller, such as the fan controller 114 described with regard to the embodiment of FIG. 1. In certain embodiments, this estimated total airflow output of the cooling fans may be calculated based on operating status and fan speed information obtained from the cooling fans and/or a fan controller. In other embodiments, the current airflow output may be determined by querying a baseboard management controller configured to monitor and/or control the cooling fans. In order to generate an estimate of the airflow delivery at each storage drive location, the estimated total airflow output of the cooling fans is divided by the number of storage drive locations that are supported by the IHS.

At step 335, an estimate for the airflow delivery to the installed location of the selected storage drive is determined based on the estimated airflow delivery per storage drive location, where the estimated delivery airflow for the selected storage drive is scaled according to the scaling factors determined for the storage drive at steps 320 and 325. As scaled, this estimated airflow delivery to the installed storage drive location reflects the impact on airflow delivery due to the physical characteristics of the storage drive, such as the reported airflow impedance of this particular storage drive, and the physical characteristics of the drive bay, the components installed in adjacent drive bays and or physical characteristics of the installed location of the storage drive. At the conclusion of step 335 the estimated airflow delivery to the installed drive location may be used, at step 365, in order to make thermal control adjustments to the airflow cooling system. As described below, these thermal control adjustments are also based on the determined airflow cooling requirements for the particular storage drive in its installed location within the IHS. These airflow requirements for the storage drive are determined starting at step 340 and may be determined in parallel or sequentially to the calculation of an estimated airflow delivery to the installed drive that begins at step 315.

The determination of the airflow requirements for the selected storage drive begins at step 340 with the determination of the applicable ambient temperature for the storage drive. As described with regard to FIGS. 2a and 2b, storage drives may be installed in various locations within an IHS, such as in front-facing drive bays, rear-facing drive bays, or within an internal middle compartment of the IHS. Different drive bay locations may rely on different sources of ambient air for ventilation. For instance, storage drives installed in front-facing drive bays may be cooled through the circulation of ambient air drawn in from a front-facing inlet, while the ventilation of rear-facing drive bays may rely on ambient air drawn from a rear-facing inlet. In some scenarios, the ambient air available for cooling at an installed storage drive location is not drawn directly from an air inlet that draws fresh, external ambient air and may instead draw ambient air indirectly from an air inlet.

Due to a variety of factors, the temperature of the ambient air drawing in at each of these air inlets may vary significantly. For instance, front-facing storage drives may draw in relatively cool 25° C. ambient air from front-facing air inlets, while the ambient air drawn at inlets for a middle internal compartment may draw in 30° C. ambient air, and rear-facing air inlets may provide rear-facing storage drives with 45° C. ambient air. In certain scenarios, the temperatures of the ambient air at these available inlets may be monitored and measured directly via a thermal sensor, such as those described with the regard to the embodiment of FIG. 1. In other scenarios, one or more of these ambient air temperatures may be derived, rather than measured directly. For instance, certain storage drive installation locations in an IHS may draw ambient air through an external ambient air inlet, but only after the air drawn through the inlet has experienced some heating before actually reaching the storage drive location. In such scenarios, the temperature of the ambient air that is actually available for cooling at the storage drive location may be derived from the temperature measured at one or more air inlets while also accounting for incidental heating of the drawn airflow before it reaches the storage drive. Such incidental heating of the airflow may result from heat dissipated by upstream components of the IHS by which the airflow is drawn on its path to the storage drive location. The determination of available ambient air temperatures at a storage drive location may vary based on the general location of an installed storage drive (e.g., in one of the rear-facing storage drive bays) and/or the specific location of the installed storage device (e.g., slot 3 of the rear-facing storage drive bays). Any of the storage drive locations within the IHS may rely on multiple sources of ambient air, such as any number or type of air inlets provided by the IHS, where these air inlets may provide airflow to storage drive either directly or indirectly.

At step 350, the airflow that is required to cool an installed storage drive is determined in light of the relevant ambient air temperature drawn at the installed location of the storage drive. In certain embodiments, the determination of airflow requirements for the selected storage drive may be determined using one or more tables that provide mappings between ambient air temperatures and corresponding airflow requirements required to cool a particular type of storage drive. For instance, in certain scenarios, a table pertaining to the selected storage drive may specify that for an ambient inlet temperature of 25° C., an airflow of 5 CFM (cubic feet per minute) from the cooling fans is required to cool the storage drive. Additionally, the table may further specify that for an ambient inlet temperature of 30° C., an airflow of 6 CFM is required to cool the selected storage drive. The table may similarly specify various airflow requirements and ambient temperature boundary conditions. In certain embodiments, the airflow requirements for the selected storage drive may be calculated at step 350 using a correlation algorithm that may be similarly used to determine the airflow requirements for the selected storage drive based on the available ambient air temperature.

As illustrated in FIGS. 2a and 2b, the front-facing drive bays 210 are arranged in rows and columns of drive bay slots that span the front of the IHS 200. In certain scenarios, the airflow requirements for installed storage drives may vary based on the specific slot the storage drive is installed in. For instance, storage drives installed in centrally-located slots may have different airflow requirements than slots that are located on the edges of the front-face of the IHS. Similarly, the specific slot in which a storage drive is installed within the drive bay slots that span the rear 220 of the IHS 200 may likewise effect the airflow requirements for the storage drive. Such differences in airflow requirements based on the specific drive bay slot in which a storage drive is installed may result from structural aspects of the construction of the IHS, such as the arrangement of the various components used to form the chassis, and/or the location of other components installed within the IHS that may impede airflow to particular drive bay slots.

As described with regard to FIGS. 2a and 2b, the difficulty in replacing an installed storage drive varies according to the installed location of the storage drive within the IHS. For instance, front-facing storage drives may be easily removable and replaceable, while internal storage drives may be considerably more difficult to access. Accordingly, in certain scenarios, storage drives that are more difficult to replace may be designated as requiring increased airflow delivery in order to maintain lower operating temperatures and improve reliability for these internal storage drives. Storage drives installed in rear-facing drive bays may likewise be designated as requiring additional airflow deliver based on the relative difficulty in accessing and replacing such storage drives.

In certain embodiments, a storage drive may be installed within proximity to certain temperature-sensitive components that serve as a basis for increased airflow requirements for the storage drive. For instance, a storage drive installed within an internal compartment of the IHS may be adjacent to one or more of the processors utilized by the IHS, in which case the airflow requirements for this storage drive may be increased in order to maintain lower operating temperatures for this storage drive, thus limiting heat buildup in proximity to the processors. In certain embodiments, the storage drive information retrieved at step 305 may specify reliability parameters for a particular storage drive, where these reliability parameters may be based on component cost, availability of replacement storage drives, and/or various other factors in addition to those specifically identified herein.

At step 355, these location-specific, airflow requirement factor for a storage drive, such as the specific drive bay slot in which the storage drive is installed, the accessibility of the installed location and the location of nearby temperature-sensitive components, may then be used to determine a scaling factor for the airflow requirements for storage drive. In certain embodiments, various combinations of these location-specific parameters for the installed location of the storage drive may be utilized to determine the airflow scaling factor for the storage drive. For instance, for a storage drive installed within a rear-facing drive bay of an IHS and which has been designated as relatively difficult to access when compared to a front-facing drive bay, a scaling factor of 1.1 may be selected, indicating a 10% increase to the reference airflow requirement. In scenarios where the storage drive is installed in an internal compartment of an IHS such that the storage drive is difficult to access, a 1.2 scaling factor may be selected, indicating a 20% increase to the reference airflow requirement for the storage drive. In scenarios where the storage drive is installed in particular drive bay slot that is significantly obscured from the airflow of the cooling fans due to structural aspects of the chassis, a 1.25 scaling factor may be selected, indicating a 25% increase to the reference airflow requirement. Other storage drives located in this same array of drive bay slots that are not similarly obscured from the airflow of the cooling fans may instead be associated with a 1.05 scaling factor, indicating a 5% increase in the airflow requirement for the storage drive. In scenarios where the storage drive is installed in an internal compartment in close proximity to the processor of the IHS, a 1.3 scaling factor may be selected, indicating a 30% increase to the reference airflow requirement for this storage drive.

At step 360 the target airflow for the selected storage drive is determined. In the described embodiment, the target airflow for the selected storage drive is determined by applying the scaling factor determined at step 355 to the airflow requirement determined at step 350. For instance, in one scenario, the ambient temperature drawn at the inlet location used by the selected storage drive indicates a 5 CFM airflow for that storage drive. In such a scenario, a 1.2 scaling factor may be selected based on the installed location of the storage drive, such as due installation in a drive bay slot that is partially obscured from the airflow generated by the cooling fans and/or due to installation in a drive by location that is difficult to access. Accordingly, at step 360 an adjusted airflow requirement of 6 CFM is calculated for the selected storage drive based on the 1.2 scaling factor, reflecting a 20% increase to the reference airflow requirement for the selected storage drive.

As described, an estimate of the airflow cooling that is delivered to the installed location of the selected storage drive is determined at step 335 based on the airflow impedance characteristics of the storage drive, the ability to ventilate heated air by bypassing the storage drive, and the estimated airflow output of the cooling system at each storage drive location. At step 365, this estimated airflow delivery to the installed location of the selected storage drive, as determined at step 335, and the target airflow for the selected storage drive, as determined at step 360, are compared in order to determine whether thermal control adjustments to the cooling fans are required. For instance, in certain scenarios, a comparison of the target airflow and the estimated airflow delivery for a storage drive may indicate that insufficient airflow is being delivered to the installed location of the storage drive. In response, the cooling fans may be operated in order to increase the total airflow until the estimated airflow at the location of the installed storage drive matches the target airflow requirement for the storage drive. In this manner, the airflow output of the cooling fans may be adjusted at step 365 until the error between the estimated airflow delivery and the target airflow is eliminated.

If a storage drive is removed from the IHS, the process of FIG. 3 may be repeated based on the characteristics of the replacement storage drive. For instance, a storage drive may be removed and replaced with an upgraded storage device that has a higher airflow impedance when compared to the replaced storage drive. The process of FIG. 3 may be used to determine any adjustments to the airflow output of the cooling fans that are needed based on the target airflow cooling requirements and estimated airflow delivery to this new storage device. In addition, the process of FIG. 3 may be repeated in scenarios where a storage drive is removed from a drive bay, and replaced with a cover plate or vent, an external connector, or the drive bay is left open. In such scenarios, the process of FIG. 3 may be repeated for all storage drives installed in drive bays that are adjacent to the new drive bay configuration, in order to account for the changes to the ability to bypass ventilated air through the gaps between the adjacent storage drives and the new drive bay configuration.

In this manner, embodiments provide the ability to provide open-loop thermal control of an airflow cooling system in a manner that can accommodate changes to the components that are being cooled. Using the provided embodiments, new components may be supported by the airflow cooling system as long as an airflow impedance and installation location can be determined for the new component, and without requiring updates to the firmware used to implement the control systems for airflow cooling system. In addition, by providing airflow cooling determinations that account for constraints resulting from the location in which a component is installed, embodiments may provide superior airflow cooling when compared to closed-loop systems that may provide cooling that is focused on the location of the utilized temperature sensors, and may thus neglect to provide sufficient cooling to components installed in all locations supported by an IHS.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A system for providing airflow cooling in an IHS (Information Handling System), the system comprising:
   one or more cooling fans configured to generate airflow that ventilates heated air from within the IHS, wherein the generated airflow provides cooling to one or more storage devices installed in the IHS by ventilating airflow around the storage devices;
   a fan controller configured to operate the one or more cooling fans to provide cooling to a first storage device of the one or more storage devices, wherein the fan controller is further configured to:
   retrieve an airflow impedance for the first storage device, wherein the airflow impedance indicates an ability to ventilate airflow around the first storage device;
   determine an estimated airflow delivery by the one or more cooling fans to the first storage device, wherein the estimated airflow delivery for the first storage device is scaled based on the airflow impedance for the first storage device;
   determine an airflow delivery target for the first storage device based on an ambient air temperature available at an installed location of the first storage device within the IHS; wherein the airflow delivery target for the first storage device is scaled based on the installed location of the first storage device within the IHS; and
   operate the one or more cooling fans in order to equalize the estimated airflow delivery to the first storage device with the airflow delivery target for the first storage device.

2. The airflow cooling system of claim 1, wherein the estimated airflow delivery for the first storage device is further scaled based on a measure of the ability to ventilate heated air by bypassing the heated air around the first storage device.

3. The airflow cooling system of claim 2, wherein the measure of the ability to ventilate heated air by bypassing the first storage device is determined based on characteristics of a first drive bay of the IHS in which the first storage device is installed.

4. The airflow cooling system of claim 3, wherein the measure of the ability to ventilate heated air by bypassing the first storage device is further determined based on characteristics of one or more drive bays of the IHS that are adjacent to the first drive bay.

5. The airflow cooling system of claim 1, wherein the airflow delivery target for the first storage device is further scaled based on the ambient air temperature available at the installed location of the first storage device within the IHS.

6. The airflow cooling system of claim 3, wherein the airflow impedance further indicates an ability to ventilate airflow around the first storage device and through the gaps between the first storage device and the first drive bay.

7. The airflow cooling system of claim 1, wherein the scaling of the airflow delivery target for the first storage device is further based on a reliability parameter for the first storage drive and an accessibility of the installed location of the first storage device within the IHS.

8. A method for utilizing one or more cooling fans to provide airflow cooling to a component of an IHS (Information Handling System), the method comprising:
retrieving an airflow impedance for the component;
determining an estimated airflow delivery by the one or more cooling fans to the component, wherein the estimated airflow delivery for the component is scaled based on the airflow impedance for the component, wherein the airflow impedance indicates an ability to ventilate airflow around the first storage device;
determining an airflow delivery target for the component based on an ambient air temperature available at an installed location of the component within the IHS; wherein the airflow delivery target is scaled based on the installed location of the component within the IHS; and
operating the one or more cooling fans in order to equalize the estimated airflow delivery to the first component with the airflow delivery target for the component.

9. The method of claim 8, wherein the estimated airflow delivery for the component is further scaled based on a measure of the ability to ventilate heated air from within the IHS by bypassing the heater air around the component.

10. The method of claim 9, wherein the measure of the ability to ventilate heated air by bypassing the component is determined based on characteristics of the installed location of the component within the IHS.

11. The method of claim 10, wherein the measure of the ability to ventilate heated air by bypassing the component is further determined based on characteristics of one or more components installed adjacent to the installed location of the component within the IHS.

12. The method of claim 8, wherein the airflow impedance further indicates an ability to ventilate airflow around the first storage device and through the gaps between the first storage device and the installed location.

13. The method of claim 8, wherein the available ambient temperature is determined based on the installed location of the component relative to an air inlet of the IHS.

14. The method of claim 8, wherein the scaling of the airflow delivery target for the component is further based on a reliability parameter for the component and an accessibility of the installed location of the component within the IHS.

15. An IHS (Information Handling System) comprising:
one or more cooling fans configured to generate airflow that ventilates heated air from within the IHS, wherein the generated airflow provides cooling to one or more storage devices installed within the IHS by ventilating airflow around the storage devices;
a fan controller configured to operate the one or more cooling fans to provide cooling to a first storage device of the one or more storage devices, wherein the fan controller is further configured to:
retrieve an airflow impedance for the first storage device, wherein the airflow impedance indicates an ability to ventilate airflow around the first storage device;
determine an estimated airflow delivery by the one or more cooling fans to the first storage device, wherein the estimated airflow delivery for the first storage device is scaled based on the airflow impedance for the first storage device;
determine an airflow delivery target for the first storage device based on an ambient air temperature available at an installed location of the first storage device within the IHS; wherein the airflow delivery target for the first storage device is scaled based on the installed location of the first storage device within the IHS; and
operate the one or more cooling fans in order to equalize the estimated airflow delivery to the first storage device with the airflow delivery target for the first storage device.

16. The IHS of claim 15, wherein the estimated airflow delivery for the first storage device is further scaled based on a measure of the ability to ventilate heated air by bypassing the heated air around the first storage device.

17. The IHS of claim 16, wherein the measure of the ability to ventilate heated air by bypassing the first storage device is determined based on characteristics of a first drive bay of the IHS in which the first storage device is installed.

18. The IHS of claim 17, wherein the measure of the ability to ventilate heated air by bypassing the first storage device is further determined based on characteristics of one or more drive bays of the IHS that are adjacent to the first drive bay.

19. The IHS of claim 17, wherein the airflow impedance further indicates an ability to ventilate airflow around the first storage device and through the gaps between the first storage device and the first drive bay.

20. The IHS of claim 15, wherein the scaling of the airflow delivery target for the first storage device is further based on a reliability parameter for the first storage device and on an accessibility of the installed location of the first storage device within the IHS.

* * * * *